United States Patent [19]
Castrucci et al.

[11] 3,785,886
[45] Jan. 15, 1974

[54] SEMICONDUCTOR DEVICE FABRICATION UTILIZING <100> ORIENTED SUBSTRATE MATERIAL

[75] Inventors: Paul P. Castrucci, Poughkeepsie; Edward G. Grochowski, Wappingers Falls; Martin S. Hess, Poughkeepie; George Maheras, Poughkeepsie; William D. North, Poughkeepsie, all of N.Y.

[73] Assignee: International Business Machines Corporation, Armonk, N.Y.

[22] Filed: Feb. 22, 1971

[21] Appl. No.: 117,534

Related U.S. Application Data

[62] Division of Ser. No. 676,451, Oct. 19, 1971, Pat. No. 3,585,464.

[52] U.S. Cl. .................... 148/175, 29/578, 29/580, 117/106, 117/201, 117/212, 148/187, 317/235 R

[51] Int. Cl. .......................... H01l 7/36, H01l 19/00

[58] Field of Search .................... 148/1.5, 174, 175, 148/186, 187; 117/106, 201, 212; 29/578, 580; 156/17; 317/234, 235

[56] References Cited

UNITED STATES PATENTS

| | | | |
|---|---|---|---|
| 3,437,890 | 4/1969 | Krohl et al. | 317/235 |
| 3,508,209 | 4/1970 | Agusta et al. | 317/235 X |
| 3,146,137 | 8/1964 | Williams | 148/175 |
| 3,379,584 | 4/1968 | Bean et al. | 148/175 |
| 3,471,324 | 10/1969 | Wilson et al. | 117/201 |
| 3,476,592 | 11/1969 | Berkenbut et al. | 117/201 |

FOREIGN PATENTS OR APPLICATIONS

| | | | |
|---|---|---|---|
| 6,607,547 | 12/1966 | Netherlands | 317/235 |
| 1,131,151 | 10/1968 | Great Britain | 317/235 |
| 6,501,818 | 8/1965 | Netherlands | 317/235 |

OTHER PUBLICATIONS

Benjamin et al. "Forming Semiconductor Structures" IBM Tech. Discl. Bull., Vol. 9, No. 1, June 1966, p. 93.

Mendelson, S., "Stacking Fault Nucleation – Silicon Substrates" J. Applied Physics, Vol. 35, No. 5, May, 1964, pp. 1570–1581.

Williams, F. V., "Effect of Orientation – Gallium Arsenide" J. Electrochem. Soc., Vol. 111, No. 7, July 1964, pp. 886–888.

Tung, S. K. "Effects of Substrate Orientation – Growth" Ibid., Vol. 112, No. 4, April, 1965, pp 436–438.

Boss et al. "Crystal Orientation – Device Fabrication" IBM Tech. Discl. Bull., Vol. 8, No. 12, May 1966, pp. 1710–1711.

Drum, C. M. "Control of Distortion – (100) Epitaxial Silicon" J. Electrochem. Soc., Vol. 114, No. 6, June 1967 pp. 142C and 144C.

Drum et al. "Geometric Stability – (100) Epitaxial Silicon" Ibid., V. 115, No. 6, June 1968, pp. 664–669.

*Primary Examiner*—Hyland Bizot
*Assistant Examiner*—W. G. Saba
*Attorney*—Thomas F. Galvin and George O. Saile

[57] ABSTRACT

A method for fabricating a semiconductor device which is composed of a monocrystalline semiconductor body having a surface crystallographic orientation substantially parallel to a <100> plane and having a PN junction formed in the body. The body has an insulator coating, such as silicon dioxide, over the PN junction. The surface state density at the semiconductor-insulator interface is very low. This low density is believed to be a reason for the increased beta in the <100> oriented material semiconductor device. Further, the device has a low defect density and few dopant precipitate sites even at high dopant levels. A monolithic integrated circuit structure composed of the monocrystalline semiconductor substrate having a surface crystallographic orientation substantially parallel to a <100> plane with a plurality of semiconductor devices within the substrate is described. The devices may be isolated from one another by PN junctions. The tolerance in a given isolated device, between the PN junction and the nearest region having a different conductivity is less then approximately 0.3 mils. This very close spacing allows substantially greater compactness of semiconductor devices within a monocrystalline semiconductor body than has ever been previously accomplished.

6 Claims, 7 Drawing Figures

*INVENTORS*
PAUL P. CASTRUCCI
EDWARD G. GROCHOWSKI
MARTIN S. HESS
GEORGE MAHERAS
WILLIAM D. NORTH

*BY* George O. Saile
*ATTORNEY*

SEMICONDUCTOR DEVICE FABRICATION UTILIZING <100> ORIENTED SUBSTRATE MATERIAL

RELATED INVENTION

U. S. Pat. application Ser. No. 608,628 of P. H. Bardell, et al. filed Oct. 21, 1966 and entitled "Semiconductor Device Fabrication Method and Product Thereof" describes a method for growing a <100> epitaxial layer on a <100> substrate which reproduces the pattern on the substrate surface directly above the substrate surface pattern.

This application is a divisional of application Ser. No. 676,451, filed Oct. 19, 1967, now U. S. Pat. No. 3,585,464.

BACKGROUND OF THE INVENTION

1. Field of the Invention

The invention relates to methods for obtaining more uniformly diffused PN junctions at very high surface concentrations, semiconductor devices having increased beta or transistor gain at both high and at low current levels, and better crystallographic perfection in the semiconductor devices.

2. Description of Prior Art

Monocrystalline semiconductor material can be grown in many different crystallographic directions. Silicon, for example, has been grown in several crystallographic directions to produce monocrystals substantially free from dislocations. In the article entitled, "Growth of Silicon Crystals Free From Dislocation" by William C. Dash in the Journal of Applied Physics, pages 459–474, VOlume 30, No. 4, April 1959, procedures for the growth of silicon monocrystals of the various crystallographic directions are given. In this article it is pointed out that the <100> and the <111> axes are generally the orientations which can be used. However, the article states that the <111> orientation is preferred over the <100> orientation. In the commercial production of semiconductor devices the <111> orientation monocrystalline silicon has been the only material used.

In the formation of monolithic integrated circuits an epitaxial layer is generally formed over the substrate monocrystalline body. The epitaxial film growth is dependent upon the crystallographic characteristics of the starting substrate. Prior to the epitaxial deposition, diffused regions are often formed in the substrate body of monocrystalline material. These regions can, for example, result in the subcollector for the subsequently fabricated transistor device. Where the monocrystalline body is silicon a pre-epitaxial oxidation diffusion is commonly used in the formation in this region. Following the formation of the diffused regions all silicon dioxide is removed before the epitaxial layer is deposited on the surface of the substrate. However, the result of the process is a surface which exhibits a high defect density where the <111> crystallographic direction substrate is utilized. This substrate condition then nucleates epitaxial growth defects, such as stacking faults, that extend into the epitaxial film. These epitaxial defects have been shown to act as nucleation sites for dopant precipitates for local regions of enhanced diffusion. The result is greater variation in device quality over the entire semiconductor chip than is desirable and resultant loss of electrical characteristics in certain of the semiconductor devices in the affected areas.

There is a strong desire to fabricate monolithic semiconductor structures having a very high concentration of active and passive devices in a single monocrystalline semiconductor chip. The circuit density lower limit for <111> oriented material is in the order of one circuit per 200 square mils where an epitaxial layer is required over the surface of the substrate semiconductor monocrystalline material and a subcollector or similar structure is utilized in the substrate material. A circuit is defined as having five transistors, two diodes and two resistors. Such circuits are illustrated in FIGS. 6 and 6a of U. S. Pat. No. 3,508,209 issued in the name of Agusta et al and assigned to the same assignee as the present invention. The reason for this is that the <111> oriented semiconductor epitaxially grows at a substantial angle of about 45° from the perpendicular which results in the effective shifting of the resulting semiconductor device in relation to the diffused region in the substrate. This effect, together with the outdiffusion effect from the region in the substrate and from the PN junction isolation region, can reduce the tolerance between the PN junction region and the region in the substrate to zero. The result is the electrical joining of these two regions and a defective semiconductor device.

SUMMARY OF INVENTION

It is an object of the present invention, therefore, to provide a semiconductor device in a body of monocrystalline semiconductor material having a surface crystallographic orientation substantially parallel to a <100> plane.

It is another object of this invention to provide a monolithic integrated circuit in a monocrystalline semiconductor body wherein a crystallographic orientation of the body is substantially parallel to the <100> plane which integrated circuit is substantially free of crystallographic defects, and has excellent beta electrical characteristics, even at low currents.

It is a further object of this invention to provide a monolithic integrated circuit in a monocrystalline semiconductor body wherein a crystallographic orientation of the body is substantially parallel to the <100> plane which integrated circuit has a circuit density of greater than in the order of 200 square mils per circuit.

It is further an object of this invention to provide a method for forming semiconductor devices in a semiconductor body having a crystallographic orientation essentially parallel to the <100> plane.

In accordance with the broad aspects of the present invention, a semiconductor device is provided which is composed of a body of monocrystalline semiconductor material, such as silicon, having a surface crystallographic orientation substantially parallel to the <100> plane. A PN junction is formed in the body and an insulator coating, such as silicon dioxide, is formed over the surface of the body containing the PN junction. The resulting density of interface states is very low. In the case of silicon dioxide-silicon, the density of interface states in the proximity of the silicon body and the insulator silicon dioxide layer is less than approximately $2 \times 10^{13}$ per $cm^2$. The formed semiconductor <100> body composed of a substrate and an epitaxial layer thereover is so defect free that substantially higher concentrations of dopants can be diffused into the body without the objectional precipitate of the dopants as sites, such as the PN junctions in the devices. For example, greater concentrations of phosphorus can be used as the dopant to form the N region of the PN junction semiconductor device wherein the phosphorus source concentration is between about $2.5 \times 10^3$ ppm. and $4.0 \times 10^3$ ppm. The junction is free of phosphorus precipitation sites and is not ragged as is the case if a <111> crystallographic orientated monocrystalline semiconductor material would have been used.

Monolithic integrated circuits can be produced which are composed of the <100> oriented material. The monolithic integrated circuit is composed of the monocrystalline substrate and a substantially defect-free epitaxial semiconductor layer grown from the substrate wherein the layer is of the <100> orientation. A plurality of semiconductor devices are provided within the substrate and the layer wherein the devices are isolated from one another with PN junctions. The tolerance between the PN junction and the nearest region having a different conductivity in the semiconductor devices is less than approximately 0.3 mils. Devices composed of <111> oriented material can not reach this close a tolerance because of the epitaxial layer growth at an angle of about 45° from the perpendicular. The <100> material epitaxial growth is substantially perpendicular to the substrate.

The foregoing and other objects, features, and advantages of the invention will be apparent from the following more particular description of the preferred embodiments of the invention, as illustrated in the accompanying drawings.

DESCRIPTION OF PREFERRED EMBODIMENTS

Figure 1:
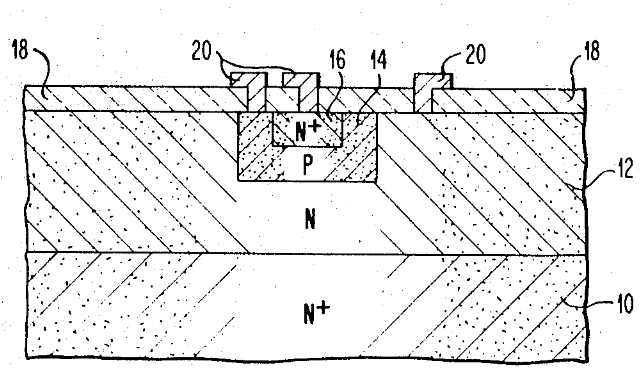
FIG. 1 is a sectional illustration of a discrete transistor device which illustrates one form of the invention.

Referring now more particularly to FIG. 1 there is shown a discrete semiconductor device. The device is fabricated by starting with a wafer or substrate 10 of N+ silicon monocrystalline material. It should, however, be evident to those skilled in the art that the conductivity type shown in the drawing is selected for illustrative purposes only and that the opposite conductivity type can be used. Further, the concentration of impurities can be increased or descreased as desired. The substrate 10 is fabricated, for example, by pulling a monocrystalline rod from a suitable melt containing a N-type material such as phosphorus or arsenic and using a seed crystal having a <100> crystallographic orientation. The resulting pulled monocrystalline rod has a <100> orientation. The rod is then sliced into very thin wafers which also have the surface crystallographic orientation of <100>. The substrate 10 is then positioned in an epitaxial growth reactor and the epitaxial layer 12 is grown on the substrate 10. The epitaxial growth reaction is made according to standard practices and is doped with suitable N-type dopants to produce an N-type epitaxial layer 12. The epitaxial layer 12 is also oriented in the <100> crystallographic orientation. Since the epitaxial growth is along the <100> plane, the growth is substantially perpendicular to the substrate. The semiconductor transistor device is then formed in the epitaxial layer 12 by base and emitter diffusions to form, respectively, the base region 14 and the emitter region 16. An insulator layer 18 covers the surface of the semiconductor device with openings to allow the electrical contact 20 to ohmically contact the elements of the transistor. The layer 18 can be any of the well known insulators such as silicon dioxide or silicon nitride and may be formed thereon by any of the conventional techniques known to those in the art.

Figure 2:
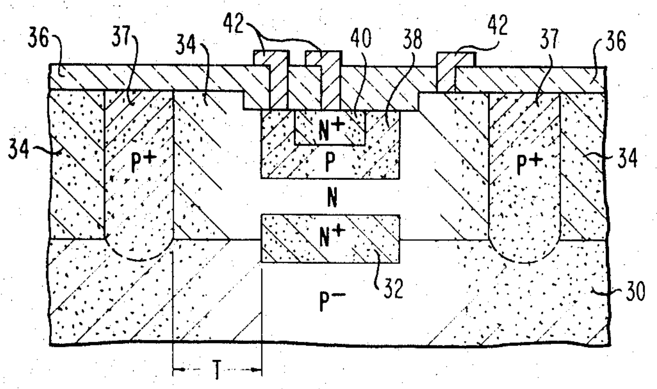
FIG. 2 is a PN junction isolated transistor device within a monolithic integrated circuit structure which is a second form of the invention.

The FIG. 2 illustrates a portion of a monolithic integrated circuit device which contains hundreds of junction isolated semiconductor devices of the type illustrated. Other devices such as diodes, resistors and capacitors (not shown) can and are formed in monolithic integrated circuits of this type along with the illustrated type device. The substrate material for substrate 30 is preferably composed of P- silicon which could preferably have a resistivity of from 10 to 20 ohms-cms. The substrate is again oriented in the <100> crystallographic orientation and is produced in a similar manner as described relative to FIG. 1. However, to obtain P-type substrate, a P- type material such as boron is used as the dopant in the melt. It is of course understood by one skilled in the art that while silicon is the preferred semiconductor material, other materials such as germanium or intermetallic materials can be used in this invention. A region of a conductivity different than the substrate is then formed in the substrate 30 which will ultimately result in the subcollector structure 32. The region is normally formed by standard diffusion techniques but could be formed by other techniques such as ion implantation and etch and refill. This region is formed by first, in the case of a silicon substrate, forming an insulating or silicon dioxide layer on the semiconductor surface by thermal oxidation. An opening is then formed in the silicon dioxide layer by conventional photolithographic masking and etching techniques. An N+ region is formed in the substrate 30 beneath the opening in the insulating layer. All insulating coating is then removed from the surface of the substrate 30 by use of suitable etching solutions. The epitaxial layer 34 is then grown on top of the substrate 30 in a conventional epitaxial reactor. The epitaxial layer 34 will be oriented in the <100> orientation since the substrate 30 is monocrystalline semiconductor having a <100> orientation. During the epitaxial growth the N+ region in the substrate 30 out-diffuses into the epitaxial layer 34 to produce the N+ subcollector 32. The entire surface of the epitaxial layer 34 is than coated with an insulator material such as by a thermal oxidation of the silicon to silicon dioxide to provide a silicon dioxide layer 36. Photolithographic techniques are then used to mask and etch a network of channels in the oxide layer 36 to expose the semiconductor surface of the layer 34. P+ type isolation regions 37 are provided, for example, by diffusing boron in the appropriate concentration, through the openings, into the epitaxial layer to a depth that extends into the substrate to fully PN junction isolate designated regions of semiconductor within the epitaxial layer. The tolerance T between the opening for the PN junction region 37 diffusion and the subcollector 32 may be less than 0.3 mils when <100> oriented material is used and provides for greater circuit density. The lower possible limit for <111> oriented material is approximately 0.5 mils. The openings are then re-oxidized and another photolithographic masking and etching procedure is accomplished to open holes in the oxide layer above selected area of the epitaxially grown layer 34. The P type base, diode and resistor regions are then diffused into the appropriate isolated epitaxially grown regions. In that portion of the monolithic circuit illustrated in FIG. 2, it is the base region 38 which is diffused through the suitable opening. The exposed surface of the epitaxial layer is then oxidized in a suitable oxidizing atmosphere. During the oxidation the impurities are caused to be driven-in to thereby completely form the base region 38. The emitter region 40 is then obtained by photolithographic and etching to open holes in the desired areas of the silicon dioxide layer and diffusing N type impurities into the desired portion of the base region 38. The surface of the epitaxial layer is again oxidized and the impurities are driven in to form the complete emitter region 40. The surface is again masked and holes are etched in the oxide for forming the contact openings to the desired semiconductor regions. A suitable contact metal is then evaporated or deposited by other means onto the semiconductor regions through the openings in the insulating coating 36. The contacts are illustrated as elements 42. A typical contact material is aluminum; however, other well known metals in the art can be used such as platinum, palladium and so forth.

Figure 3:
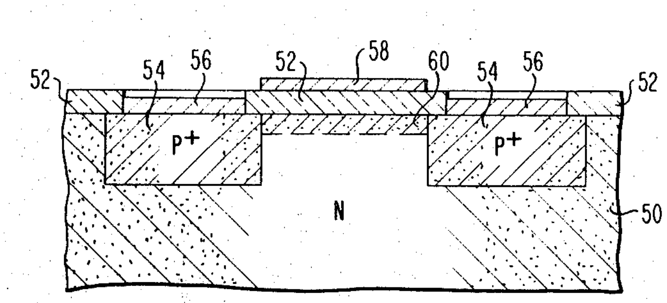
FIG. 3 is a field effect transistor device which is a third form of the invention.

FIG. 3 shows a unipolar transistor whose electrical characteristics are substantially improved by using the <100> oriented material. The unipolar transistor is composed of a silicon semiconductor body 50 having a crystallographic orientation substantially parallel to <100> plane. A layer of silicon dioxide 52 covers the surface of the body 50. Diffused P+ source-drain regions 54 are formed in the body 50. Electrical contacts 56 ohmically connect the regions 54 to external connectors. The gate electrode 59 regulates the flow of carriers in the channel 60 between the two source-drain region 54. The low donor surface state density of the <100> oriented silicon-silicon dioxide interface is a particular advantage in field effect transistors. A specific value of gate bias applied to the electrode 58 is necessary to deplete carriers in channel 60 with respect to the source-drain electrodes 54. The threshold voltage required to invert this channel is substantially less for <100> than <111> oriented material due to the surface state density. Larger values for transconductance can be, therefore, obtained at a minimum gate bias.

The <100> oriented substrate prior to initial oxidation of the semiconductor body 10, 12 in FIG. 1 and 30 in FIG. 2 contains fewer inherent crystallographic defects than a <111> oriented substrate. A more perfect substrate in the <100> instance yields a defect-free epitaxial film, which in turn can produce diffused junctions of very high electrical quality. The substrate condition that nucleates epitaxial growth defects such as stacking faults which extend into the epitaxial film. Normal defect densities may be as high as 50,000/centimeter$^2$ with <111> oriented material. When the collector/base junctions and the emitter/base junctions are formed by dopant diffusion, the junction quality, characterized by breakdown voltage, leakage currents, may be adversely affected by these high defect densities. This is especially the case if a gold diffusion step is utilized to limit minority carrier lifetime and to improve the beta of the circuits. The epitaxial film oriented in the <100> direction exhibits stacking fault densities below 100/centimeter$^2$ for a like epitaxially grown material. Diffusions with maximum surface concentrations of, for example, $10^{21}$ atoms/centimeter$^3$ are desired for the shallow junctions depths used in high speed monolithic integrated device structures. Increased dopant concentration yields lower contact resistances at emitter and base contacts, thereby producing low forward voltage drops. With <100> oriented material semiconductor devices, these high dopant concentrations yield good junction quality without inducing crystallographic imperfections characterized by ragged junctions as is obtained when using identical dopant concentration in the <111> oriented material. These effects can be seen particularly in the monolithic integrated transistor structures. Ragged junctions yield uneven base widths which limit beta (transistor gain) control. The worst case situation is a shorting at the emitter/collector region at low biasing potentials ("punch-through").

A large emitter and base area junction is required in the case of a discrete semiconductor device or in a monolithic integrated circuit application for high voltage and high current devices. The <100> oriented device structures yield large area junctions free of crystallographic defect thereby exhibiting a good junction quality. The probability of including a crystallographic defect in the junction area has increased probabilities due to the large area. The value of substantially defect-free material of the <100> orientation is greater since it will produce substantially higher device yields than the presently used <111> oriented material.

Silicon wafers of <100> oriented material and <111> oriented material were produced by identical procedures as to produce the FIG. 2 device as described above. The difference in the process involved only the diffusion source concentration for the emitter region. Source concentrations of phosphorus of 1.5, 2.5, and 4.0 × $10^3$ ppm were diffused into wafers of both <100> oriented and <111> oriented material. The results showed substantial phosphorus precipitation at 2.5 and 4.0 × $10^3$ ppm for the <111> oriented material. No precipitation was detected on the <100> oriented material except that for a small amount detected at 4 × $10^3$ ppm. The precipitation centers in the <111> material effectively reduce the source concentration of phosphorus resulting in shallow but very ragged junctions. It is therefore seen that phosphorus concentrations between about 2.5 × $10^3$ ppm and 4.0 × $10^3$ ppm in <100> oriented material produce junctions which substantially free of precipitation sites. This has never been achieved previously because of the inherent precipitation problems in the <111> oriented material.

Figure 4A:
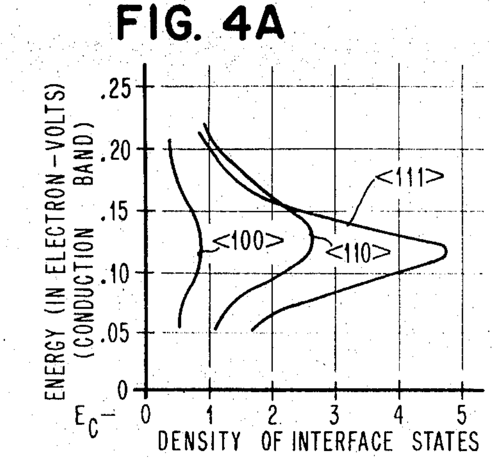
FIGS. 4A and 4B are graphical representations showing the density of silicon dioxide-silicon interface states versus energy in eV.
Figure 4B:
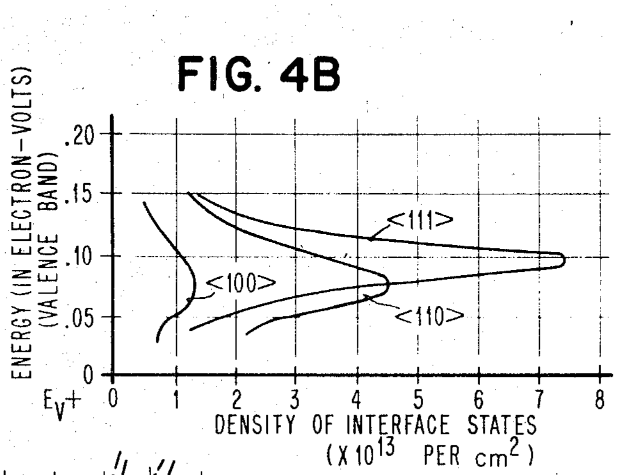

A portion of the base current of a semiconductor device is lost by surface recombination. FIGS. 4A and 4B illustrate that the —100> oriented material has a lower surface-charge than <111> and <110> material. This fact is true regardless of type of semiconductor material utilized. The FIGS. 4A and 4B, however, illustrate the case where one ohm-centimeter silicon is used as a substrate and a silicon dioxide layer is thermally grown on the substrate in oxygen with 80 ppm $H_2O$ at 1000°C. The density of silicon dioxide-silicon interface states versus energy is given for the conduction band edge, $E_c$ in FIG. 4A and the valence band edge $E_v$in FIG. 4B. The base recombination current is directly related to the surface state charge and will control the low current beta of a transistor.

The following example is included merely to aid in the understanding of the invention, and variations may be made by one skilled in the art without departing from the spirit and scope of this invention.

EXAMPLE

Fifty wafers each of <111> and <100> oriented material were obtained by the process of separately growing rods of monocrystalline silicon by pulling material from a melt containing the desired impurity concentration and then slicing the pulled member into the plurality of wafers. The 50 wafers each were divided into five runs of ten wafers per run. Each run then consisted of ten wafers of <111> material and ten wafers of <100> material. Monolithic integrated circuit devices were formed in each of the wafers according to the fabrication method and the monolithic integrated circuit structure described in the United States Patent Aplication Ser. No. 539,210 of B. Agusta et al. filed March 31, 1966, now U.S. Pat. No. 3,508,209 issued April 21, 1970, and entitled "Monolithic Integrated Structure Including Fabrication and Package Therefore". FIG. 2 of the present patent application illustrates the sectional structure of a transistor device within the monolithic integrated circuit structure. Ten test sites were formed in each wafer. Single transistors which can be electrically contacted for obtaining the electrical characteristics of the transistors located in the monolithic integrated circuit are located on each test site.

The fabrication process briefly involves starting with the ten wafers each of <100> and <111> material having a P− type conductivity with a resistivity of 10 to 20 ohm-centimeter. A silicon dioxide layer having a thickness of 5,200 Angstroms was then thermally grown on the surface of each of the silicon wafers. Photolithographic masking and etching techniques were used to open holes in the desired areas of the silicon dioxide layer to expose the silicon semiconductor surface. A buffered hydrofluoric acid solution was used as the etchant. A N+ type region was formed in the silicon semiconductor substrate by diffusion of arsenic. The resulting surface concentration was $C_o$ of $10^{20}$ atoms $cm^{-3}$ of N type majority carriers in the diffused region. The silicon dioxide layer served as a diffusion mask during the diffusion operation. The silicon dioxide layer was then completely removed with a buffered hydrofluoric acid solution. The wafers were then placed in epitaxial growth chamber and a epitaxial layer of 5.5 to 6.5 microns in thickness having a resistivity of 0.2 ohm per centimeter was formed on the substrate. The epitaxial layer was arsenic doped during the deposition. The wafers were then oxidized to form a silicon dioxide layer on the surface of the epitaxial layer. Photolithographic masking and etching was used to open holes in this silicon dioxide layer at the locations where isolation diffusions are required. P+ isolation regions were then formed to isolate certain areas of the semiconductor epitaxial layer using a boron dopant to form a $C_o$ (surface concentration) of $5 \times 10^{20}$ atoms $cm^{-3}$. The diffusion operation was carried out at a temperature of 1,200°C for a period of 95 minutes. The epitaxial surface was then reoxidized by thermally heating the surface at a temperature of approximately 1,000°C for a period of five minutes. Photolithographic masking and etching was then used to open holes in the silicon dioxide layer for the base diffusion. The base diffusion used boron as the impurity source and was carried out for a time of 70 minutes at 1,075°C to form the base region having a surface concentration of $5 \times 10^{19}$ atoms $cm^{-3}$. The surface was then reoxidized using a heating cycle of 25 minutes in dry oxygen, 10 minutes in steam, and 15 minutes in dry oxygen at 1,150°C. Photolithographic and etching techniques were used to open holes in the silicon dioxide layer for an emitter diffusion. Phosphorus was diffused into the base regions of the device to form the emitter regions. Following this emitter diffusion, an emitter drive-in and oxidation heat treatment step was accomplished. The drive-in cycle was at 970°C. The cycle involved five minutes in dry oxygen, followed by 55 minutes steam and then dry oxygen. The photolithographic masking and etching techniques were used again to open the holes in the silicon dioxide layer. A layer of aluminum was then deposited over the entire wafer surface. Portions of this aluminum layer were then etched away to produce the desired interconnection pattern. The aluminum etchant was a warm solution of phosphoric acid, nitric acid and water.

The test sites for all 50 wafers of both <111> material and <100> material were used for extensive electrical testing of the monolithic integrated circuit devices formed in the wafers. The following Chart I is the average data for all tests made in the five runs.

CHART I

| Electrical | Orientation | |
|---|---|---|
| Parameter | <111> | <100> |
| $BV_{EB}$ at 10μ a | 6.5 | 7.2 |
| $BV_{CB}$ at 10μ a | 35 | 35 |
| $BV_{CEO}$ at 5 ma | 12 | 12 |
| $BV_{CIO}$ | 12 volts | 25 volts |
| $FV_{CB}$ at 1 ma | 0.78 | 0.78 |
| $FV_{EB}$ at 1 ma | 0.79 | 0.79 |
| Vcc = 1 V | | |
| $I_c$ = 3 ma | 25 | 25 |
| $I_c$ = 100 ma | 1 | 5 |

Figure 5:
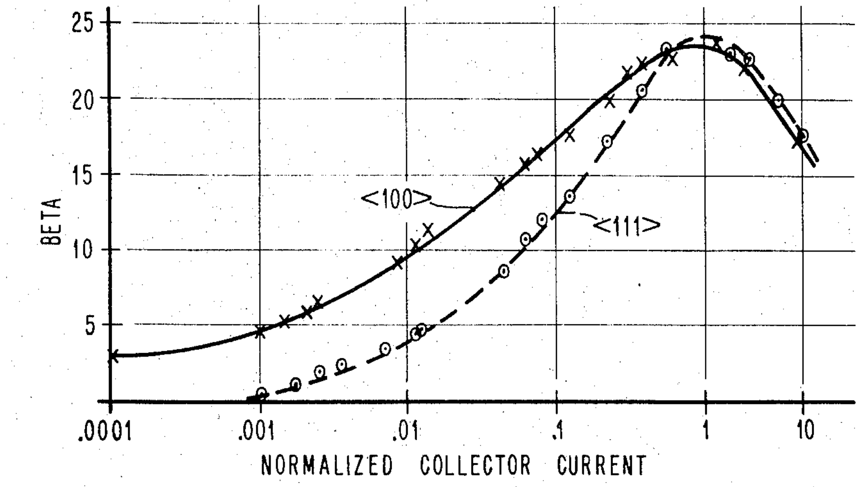
FIG. 5 is a graphical illustration of beta versus normalized collector current comparing monolithic integrated circuit devices fabricated in <100> material and <111> material.

FIG. 5 is a graphical illustration of Beta or the transistor gain versus the normalized collector current Ic/(Ic peak). It is clear from this graphical illustration that the important electrical characteristic Beta drops off much faster for the <111> oriented material than for the <100> oriented material. For currents of 0.001 peak value of collector current, the Beta value is five times higher for the <100> material than for the <111> material. The graphical illustration dramatically shows how the <100> oriented material extends the useful current range of the semiconductor devices by as much as two orders of magnitude. The use of <100> material can therefore be used at lower current and lower power operations which allow increased packing density of circuits in a given area without the necessity of liquid cooling techniques to disperse the heat.

Figure 6:
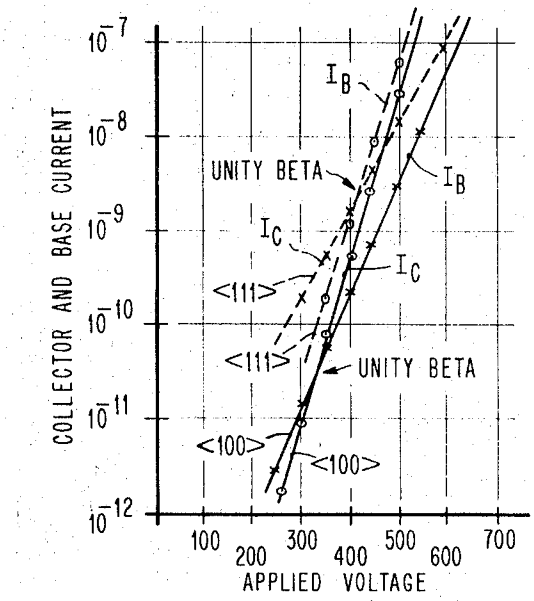
FIG. 6 is a Gummel plot of collector and base current versus applied voltage.

FIG. 6 is a Gummel plot of collector and base currents versus applied voltage for transistor structures for both the <111> and <100> oriented material. This plot was made to insure that the improved effect shown by the <100> material over <111> oriented material is not a base channel phenomenon since the linear slope of the collector and base current versus applied voltage on a semilogarithmic scale represents best case semiconductor junction conduction. If a base channel phenomenon were present, the slope would break away from its linear condition.

The structure of the present invention wherein at least one PN junction is formed in a substantially defectfree epitaxial layer of <100> crystallographic orientation may be used in high current, high power devices having a current-carrying capacity of more than about one amp.

While the invention has been particularly shown and described with reference to a preferred embodiment thereof, it will be understood by those skilled in the art that various changes in form and details may be made therein without departing from the spirit and scope of the invention.

What is claimed is:

1. The method of fabricating a monolithic integrated circuit device comprising:

providing a monocrystalline silicon semiconductor substrate of one conductivity having a plurality of regions therein of another conductivity;

said substrate having a surface crystallographic orientation parallel to the <100> plane;

growing an epitaxial layer of said other conductivity having a surface crystallographic orientation parallel to the <100> plane from the said substrate and substantially perpendicular to said substrate;

said regions diffusing into said layer and extending in all directions in said substrate by diffusion during the growth of said layer;

forming PN isolation regions surrounding said regions in said substrate and extending through said layer to said substrate and extending through said layer to said substrate, the distance between said PN isolation regions and said regions in said substrate being less than 0.3 mils, and being sufficient to avoid electrical shorting therebetween; the circuit area density being greater than one circuit per 200 square mils; and forming semiconductor devices over said regions in said substrate.

2. The method of fabricating a monolithic integrated circuit structure comprising:

providing a monocrystalline silicon semiconductor substrate having a surface crystallographic orientation parallel to the <100> plane;

forming an insulator layer over the surface which results in a density of interface states at the insulator layer to semiconductor interface of less than approximately $2 \times 10^{13}$ per $cm^2$;

forming a plurality of PN junctions wherein the N regions are formed by an open tube diffusion process with the phosphorus source concentration being between about $2.5 \times 10^3$ ppm and $4.0 \times 10^3$ ppm, said junctions being passivated by said insulation layer;

and electrically connecting the devices formed at least in part by said PN junctions to produce desired circuits.

3. The method of claim 2 wherein the circuit area density is greater than about one circuit per 200 square mils.

4. The method of claim 3 wherein after said providing step, an epitaxial layer is grown on said substrate having a surface crystallographic orientation parallel to the <100> plane from the said substrate and substantially perpendicular to said substrate.

5. The method of fabricating a monolithic integrated circuit device comprising:

providing a monocrystalline silicon semiconductor substrate of one conductivity having a plurality of regions therein of another conductivity;

said substrate having a surface crystallographic orientation parallel to the <100> plane;

growing an epitaxial layer of said other conductivity having a surface crystallographic orientation parallel to the <100> plane from the said substrate and substantially perpendicular to said substrate;

said regions diffusing into said layer and extending in all directions in said substrate by diffusion during the growth of said layer;

forming an insulator layer over the surface of said layer which results in a density of interface states at the insulator layer to epitaxial semiconductor layer interface of less than approximately $2 \times 10^{13}$ per $cm^2$;

forming PN isolation regions surrounding said regions in said substrate and extending through said layer to said substrate with a tolerance between the isolation region and said regions of less than 0.3 mils, and being sufficient to avoid electrical shorting therebetween; the circuit area density being greater than one circuit per 200 square mils; and forming semiconductor devices over said regions in said substrate.

6. The method of claim 5 wherein after the forming of said semiconductor devices, gold is diffused into said devices as an impurity to limit minority carrier lifetime and to improve the gain of the said devices.

* * * * *

PO-1050
(5/69)

UNITED STATES PATENT OFFICE

CERTIFICATE OF CORRECTION

Patent No. 3,785,886 Dated January 15, 1974

Inventor(s) Paul P. Castrucci et al.

It is certified that error appears in the above-identified patent and that said Letters Patent are hereby corrected as shown below:

| | |
|---|---|
| Column 6, Line 68<br>(In the Application,<br>Page 14, Line 26) | change "--100 " to<br>-- <100> -- |

Signed and sealed this 10th day of December 1974.

(SEAL)
Attest:

McCOY M. GIBSON JR.
Attesting Officer

C. MARSHALL DANN
Commissioner of Patents